United States Patent

Ahn

(10) Patent No.: US 8,015,986 B2
(45) Date of Patent: Sep. 13, 2011

(54) APPARATUS FOR CLEANING SUBSTRATE AND METHOD FOR CLEANING SUBSTRATE

(75) Inventor: Young-ki Ahn, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 255 days.

(21) Appl. No.: 12/195,054

(22) Filed: Aug. 20, 2008

(65) Prior Publication Data

US 2009/0050173 A1    Feb. 26, 2009

(30) Foreign Application Priority Data

Aug. 24, 2007 (KR) .................. 10-2007-0085596

(51) Int. Cl.
*B08B 3/12* (2006.01)
(52) U.S. Cl. .................. 134/137; 134/184; 134/198
(58) Field of Classification Search ............ 134/137
See application file for complete search history.

(56) References Cited

U.S. PATENT DOCUMENTS

| | | | | |
|---|---|---|---|---|
| 4,961,424 A | * | 10/1990 | Kubota et al. ........... | 601/2 |
| 2005/0206476 A1 | * | 9/2005 | Ella et al. ............. | 333/133 |
| 2006/0066181 A1 | * | 3/2006 | Bromfield et al. ....... | 310/363 |
| 2007/0122559 A1 | * | 5/2007 | Shirakashi et al. ..... | 427/457 |
| 2007/0164631 A1 | * | 7/2007 | Adachi et al. .......... | 310/311 |

FOREIGN PATENT DOCUMENTS

| | | |
|---|---|---|
| CN | 1712144 A | 12/2005 |
| JP | 08-117711 | 5/1996 |
| JP | 2000-216126 | * 8/2000 |
| JP | 2004-356590 | 12/2004 |
| JP | 2007-029937 | 2/2007 |
| JP | 2007-209928 | 8/2007 |
| KR | 1020060122741 | 11/2006 |

OTHER PUBLICATIONS

Machine translation of JP2004-356590 (Dec. 2004).*
Machine translaation of JP2000-216126 (Aug. 2000).*

* cited by examiner

*Primary Examiner* — Michael Kornakov
*Assistant Examiner* — Nicole Blan
(74) *Attorney, Agent, or Firm* — Carter, DeLuca, Farrell & Schmidt, LLP

(57) ABSTRACT

Provided is an apparatus for cleaning a substrate. The apparatus includes a stage on which a substrate is loaded, a cleaning liquid supply unit supplying a cleaning liquid to the substrate, an oscillator transmitting sound waves to the substrate for cleaning the substrate, and at least two piezoelectric members disposed on an end portion of the oscillator at a predetermined distance apart from each other so as to generate the sound waves.

12 Claims, 8 Drawing Sheets

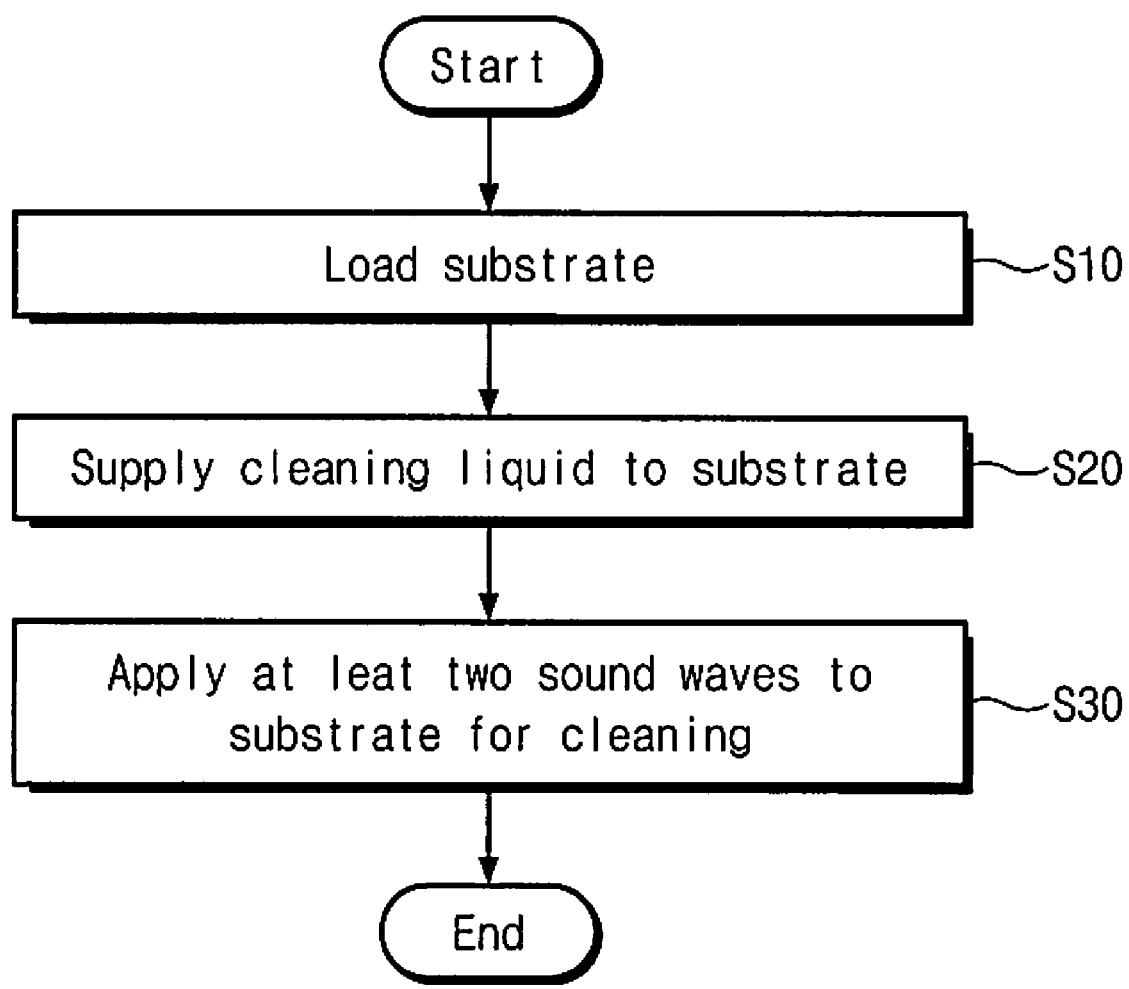

APPARATUS FOR CLEANING SUBSTRATE AND METHOD FOR CLEANING SUBSTRATE

CROSS-REFERENCE TO RELATED APPLICATIONS

This U.S. non-provisional patent application claims priority under 35 U.S.C. §119 of Korean Patent Application No. 10-2007-0085596, filed on Aug. 24, 2007, the entire contents of which are hereby incorporated by reference.

BACKGROUND OF THE INVENTION

The present invention disclosed herein relates to an apparatus and method for treating a substrate, and more particularly, to an apparatus and method for cleaning a substrate using sound wave energy.

Electronic devices such as semiconductor memory devices and flat display devices include a substrate. The substrate may be a silicon wafer or a glass substrate. The substrate includes a plurality of conductive patterns and a plurality of insulation patterns for insulating the conductive patterns. The conductive patterns and the insulation patterns are formed through a series of processes such as exposing, developing, and etching processes.

The processes include a process of removing impurity particles. For example, since impurity particles on the substrate may contaminate the patterns and cause defective patterns, an impurity removing process is necessary. Impurities can be chemically or physically removed from a substrate. In a chemical impurity removing method, the surface of a substrate is treated using a chemical. In a physical impurity removing method, impurity particles adsorbed on a substrate is removed by applying a physical force.

However, since recent highly-integrated semiconductor memory devices have 1-μm or less patterns, allowable impurity particle sizes of substrates are very small. Thus, it is difficult to remove small impurity particles from substrates using typical substrate cleaning methods.

SUMMARY OF THE INVENTION

The present invention provides an efficient apparatus and method for cleaning a substrate.

Embodiments of the present invention provide apparatuses for cleaning a substrate, the apparatus including a stage, a cleaning liquid supply unit, an oscillator, and at least two piezoelectric members. A substrate is loaded on the stage. The cleaning liquid supply unit supplies a cleaning liquid to the substrate. The oscillator transmits sound waves to the substrate for cleaning the substrate. The piezoelectric members are disposed on an end portion of the oscillator so as to generate the sound waves. The piezoelectric members are spaced apart from each other.

In other embodiments of the present invention, methods for cleaning a substrate include loading a substrate on an upper portion of a stage, supplying a cleaning liquid to the substrate, and cleaning the substrate by applying sound waves to the substrate from at least two sources.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 7 is a flowchart illustrating a method of cleaning a substrate according to an embodiment of the present invention.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
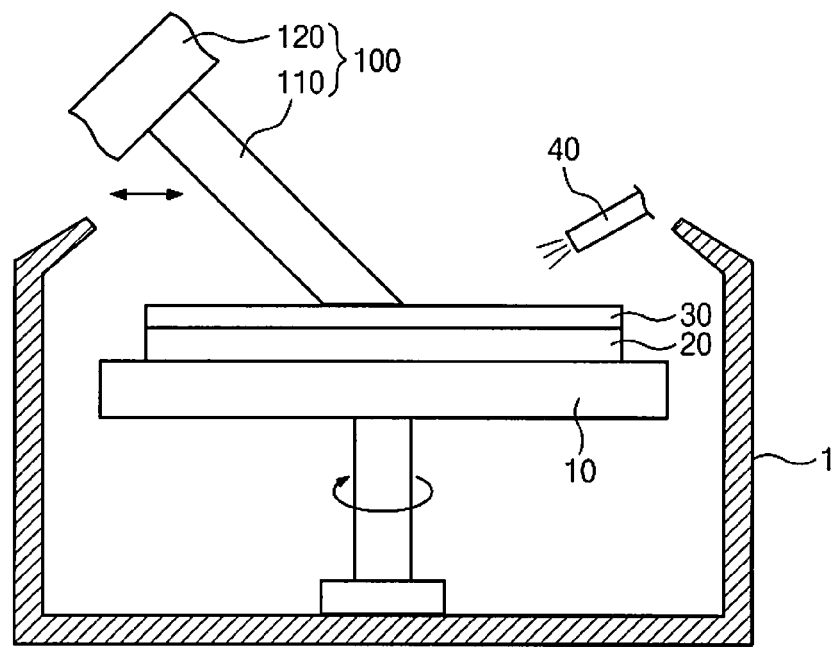
FIG. 1 is a schematic cross-sectional view illustrating an apparatus for cleaning a substrate according to an embodiment of the present invention.

FIG. 1 is a schematic cross-sectional view illustrating an apparatus for cleaning a substrate according to an embodiment of the present invention;

Referring to FIG. 1, the substrate cleaning apparatus includes a cleaning container 1, a stage 10, a cleaning liquid supply unit 40, and a vibration unit 100. The stage 10 is mounted on the bottom of the cleaning container 1. A substrate 20 is placed on the stage 10. The stage 10 may be a chuck configured to support and fix the substrate 20. The chuck may fix the substrate 20 using a vacuum suction force or an electric force. The stage 10 is connected to a driving unit such as a motor. The motor rotates the stage 10. Thus, the substrate 20 placed on the stage 10 can be rotated while it is being cleaned.

The cleaning container 1 has an opened top portion, and the cleaning liquid supply unit 40 is disposed at the opened top portion of the cleaning container 1. The cleaning liquid supply unit 40 is spaced a predetermined distance apart from the substrate 20 and is oriented toward the substrate 20. The cleaning liquid supply unit 40 may be an injection nozzle. The cleaning liquid supply unit 40 is configured to continuously supply a cleaning liquid to the substrate 20. Since the cleaning liquid supply unit 40 supplies a cleaning liquid continuously to the substrate 20 during a cleaning process, a cleaning liquid layer 30 can be formed on the surface of the substrate 20.

Deionized water ($H_2O$) may be used as the cleaning liquid for removing impurities from the substrate 20 and rinsing the substrate 20. Alternatively, a chemical may be used as the cleaning liquid. The chemical may be selected according to cleaning conditions. Examples of the chemical include: a mixture of aqueous ammonia ($NH_4OH$), hydrogen peroxide ($H_2O_2$), and deionized water ($H_2O$); a mixture of hydrofluoric acid (HF) and deionized water ($H_2O$); a mixture of ammonium fluoride ($NH_4F$), hydrofluoric acid (HF), and deionized water ($H_2O$); and a mixture of phosphoric acid ($H_3PO_4$) and deionized water ($H_2O$). One of the listed chemicals may be used as the cleaning liquid, or some of the listed chemicals may be mixed to be used as the cleaning liquid or may be sequentially used as cleaning liquids.

The vibration unit 100 includes an oscillator 110 and a vibration generator 120. The vibration generator 120 generates vibrations using sound-wave energy, and the oscillator 110 applies a strong ultrasonic wave vibration to the cleaning liquid layer 30. The vibration generator 120 is coupled to an end portion of the oscillator 110. The vibration generator 120 includes a piezoelectric unit for converting electric energy into physical vibration energy.

During a cleaning process, the substrate 20 is rotated in a predetermined direction, and the vibration unit 100 is horizontally moved to apply a strong vibration to the cleaning liquid layer 30 using a sound wave. The strong vibration applied to the cleaning liquid layer 30 collapses cavitation bubbles and creates gaps between impurity particles. The collapsing cavitation bubbles permeate into the gaps between the impurity particles and collapse in the gaps so that the impurity particles can be easily and completely separated from the surface of the substrate 20. If impurity particles are very small, megasonic waves may be used for removing the small impurity particles from the substrate 20. For example, if the sizes of the impurity particles are very small at about 1 μm or less, ultrasonic cleaning may be performed in the megahertz frequency range.

The oscillator 110 is shaped like a rod and is inclined at an angle from the substrate 20. Alternatively, although not shown in FIG. 1, the oscillator 110 may be parallel or perpendicular to the substrate 20. The oscillator 110 may be formed of quartz, which is known as an efficient material for transferring ultrasonic energy. Quartz can be used with almost every kind of cleaning liquid. However, when the oscillator 110 is formed of quartz, the oscillator 110 can be etched by a cleaning liquid including a hydrofluoric acid (HF). In the case where a cleaning liquid with a hydrofluoric acid (HF) is used, the oscillator 110 may be formed of quartz and one of sapphire, silicon carbide, boron nitride, carbon glass, and a combination thereof.

Figure 2:
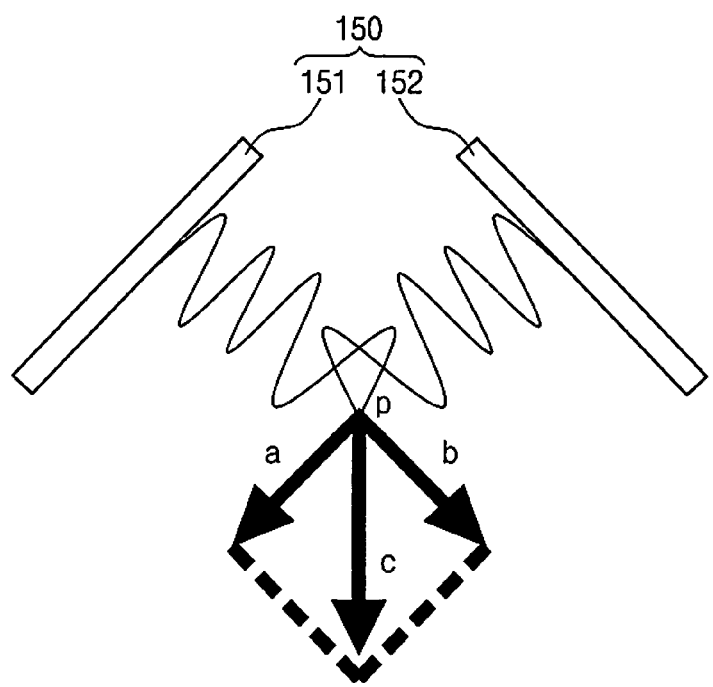
FIG. 2 illustrates vibration generating procedures using two piezoelectric members disposed in a vibration generator of the substrate cleaning apparatus of FIG. 1, according to an embodiment of the present invention.

FIG. 2 is a view illustrating vibration generating procedures using two piezoelectric members installed in the vibration generator 120 illustrated in FIG. 1, according to an embodiment of the present invention.

Referring to FIG. 2, a piezoelectric unit 150 is disposed in the vibration generator 120. The piezoelectric unit 150 generates vibration based on the piezoelectric effect. When a piezoelectric material is mechanically deformed, the piezoelectric material exhibits dielectric polarization such that mechanical energy can be converted into electric energy. This is called the piezoelectric effect or the first piezoelectric effect. On the other hand, when an electric field is applied to a piezoelectric material, the piezoelectric material is mechanically deformed. This is called the converse piezoelectric effect or the second piezoelectric effect. The vibration generator 120 generates sound waves using mechanical energy based on the converse piezoelectric effect, and the sound waves are transmitted to the oscillator 110.

The piezoelectric unit 150 includes a first piezoelectric member 151 and a second piezoelectric member 152 that are spaced apart from each other. The first and second piezoelectric members 151 and 152 are inclined at an angle from a vertical line. The first piezoelectric member 151 is located at the left side of the second piezoelectric member 152. The first piezoelectric member 151 receives electric energy to generate sound waves. The sound waves propagate in a direction substantially perpendicular to the first piezoelectric member 151. The second piezoelectric member 152 is located at the right side of the first piezoelectric member 151. The second piezoelectric member 152 receives electric energy to generate sound waves. The sound waves propagate in a direction substantially perpendicular to the second piezoelectric member 152. Hereinafter, a sound wave generated from the first piezoelectric member 151 will be referred to as a first sound wave, and a sound wave generated from the second piezoelectric member 152 will be referred to as a second sound wave.

Initially, first and second sound waves propagate individually. Then, the first and second sound waves meet each other at a predetermined position where the first and second sound waves combine to form a new sound wave. Hereinafter, the new sound wave will be referred to as a third sound wave. The intensity (c) of the third sound wave may be calculated by the vector sum of the first sound wave and the second sound wave.

As explained above, when the piezoelectric unit 150 includes a plurality of piezoelectric members, the piezoelectric unit 150 can generate a strong sound wave as compared with the case where the piezoelectric unit 150 includes a single piezoelectric member. Thus, impurities can be easily removed from a substrate using the strong sound waves. Particularly, since recent highly-integrated semiconductor memory devices have much finer patterns, allowable impurity particle sizes are very small. Thus, high-frequency sound waves are necessary for removing small impurity particles. For example, 3-MHz or higher frequency ultrasonic waves may be necessary for removing impurity particles from 1-μm or less patterns.

However, if the frequency of ultrasonic waves increases, the power of the ultrasonic waves reduces because the amplitude of ultrasonic waves reduces. In this case, it may be difficult to remove impurity particles. However, in the current embodiment, the piezoelectric unit 150 includes a plurality of piezoelectric members to generate high-frequency ultrasonic waves having high power so that fine impurity particles can be easily removed.

The first and second sound waves may combine at a predetermined position so as to allow the third sound wave to propagate directly to the substrate 20 or the cleaning liquid layer 30. Hereinafter, a position where the first and second sound waves combine with each other will be referred to as a combining position (p). For example, the combining position (p) may be located on a surface of the oscillator 110. In this case, the length of the oscillator 110 may be used to calculate traveling distances of the first and second sound waves to the combining position (p). Therefore, the arrangement of the first and second piezoelectric members 151 and 152 can be adjusted based on the calculated traveling distances of the first and second sound waves so as to allow the first and second sound waves to interfere constructively with each other at the combining position (p). In this case, the energy of the third sound wave can be maximized, and thus the substrate 20 can be cleaned more efficiently.

Figure 3A:
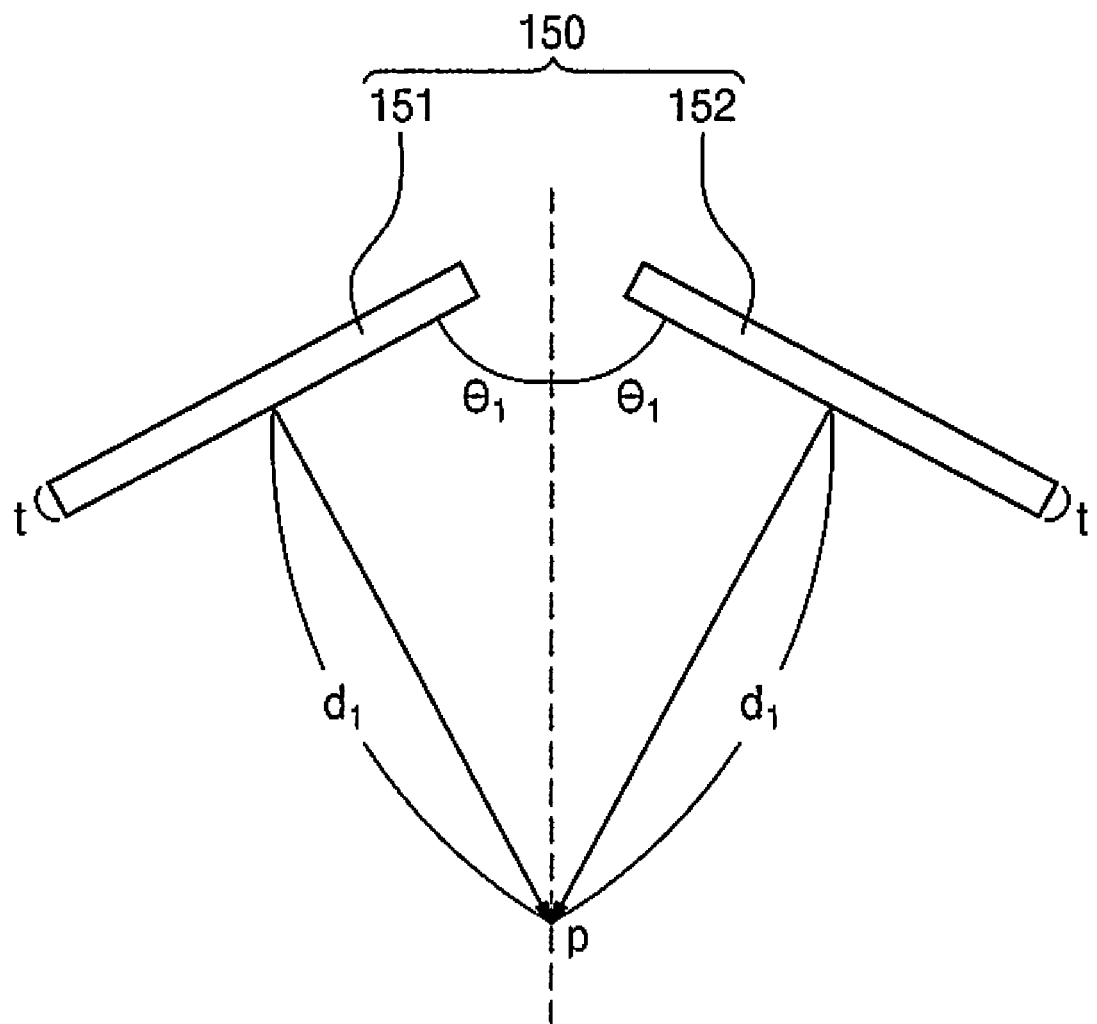
FIGS. 3A and 3B illustrate exemplary symmetric arrangements of the two piezoelectric members disposed in the vibration generator of the substrate cleaning apparatus of FIG. 1, according to embodiments of the present invention.
Figure 3B:
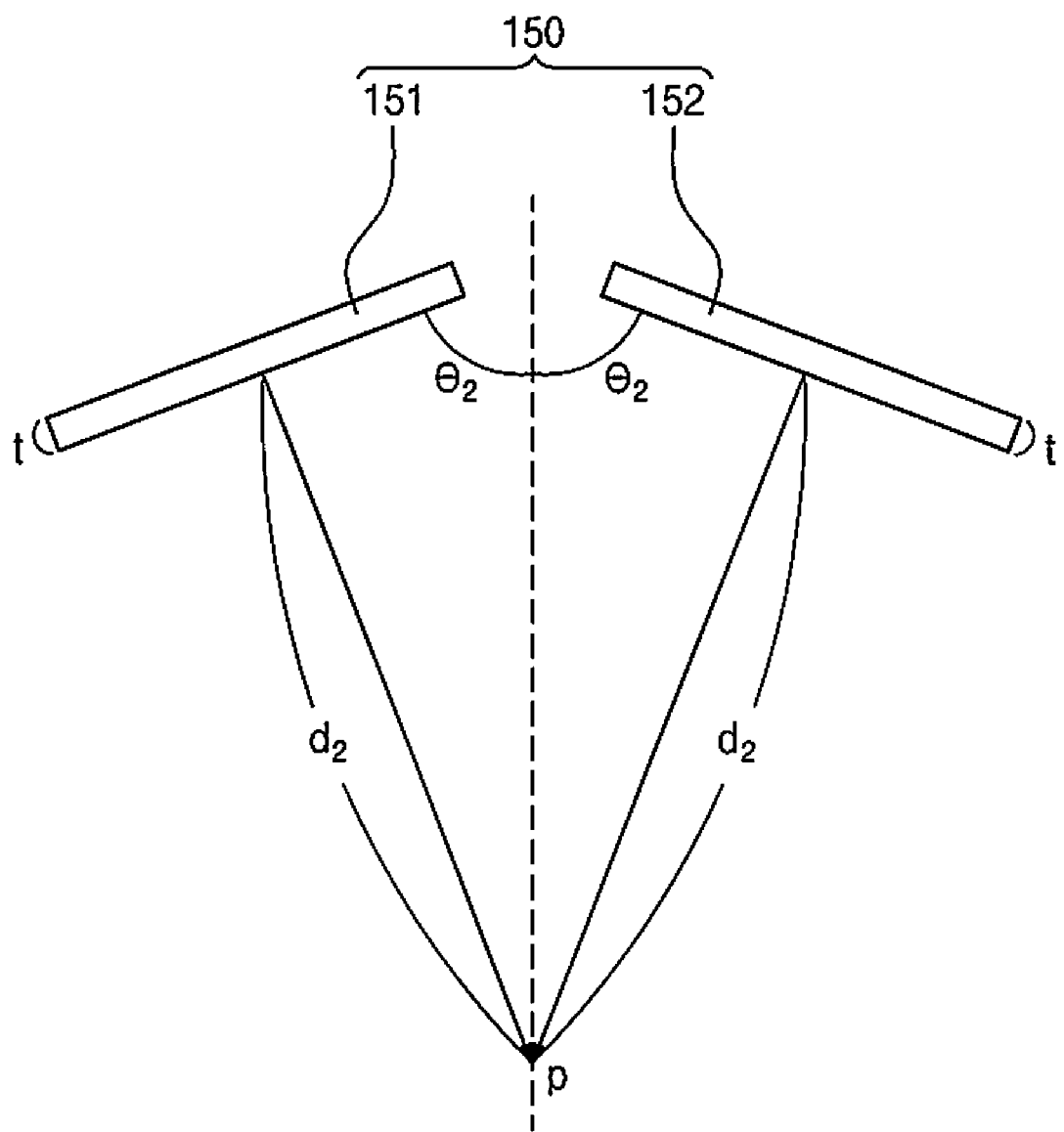

FIGS. 3A and 3B illustrate exemplary symmetric arrangements of the two piezoelectric members 151 and 152 of the vibration generator 120 of FIG. 1, according to embodiments of the present invention.

Referring to FIG. 3A, the first piezoelectric member 151 is disposed on the left and inclined at a first angle $\theta_1$ from a dashed vertical centerline. The second piezoelectric member 152 is disposed on the right and inclined at a first angle $\theta_1$ from the dashed vertical centerline. The first and second piezoelectric members 151 and 152 have the same thickness (t).

The thickness (t) of the first and second piezoelectric members 151 and 152 is related with the frequency of sound waves generated from the first and second piezoelectric members 151 and 152. The thickness (t) of the first and second piezoelectric members 151 and 152 is inverse proportional to the frequency of sound waves generated from the piezoelectric members 151 and 152. Therefore, when the first and second piezoelectric members 151 and 152 have the same thickness (t), the first and second piezoelectric members 151 and 152 generate sound waves having the same frequency.

A first sound wave generated from the first piezoelectric member 151 combines with a second sound wave generated from the second piezoelectric member 152 at a combining position (p) located on the dashed vertical centerline. Since the first and second piezoelectric members 151 and 152 are symmetric with respect to the dashed vertical centerline, the first and second sound waves travel the same first distance $d_1$ to the combining position (p). Then, the first and second sound waves combine with each other at the combining position (p). In general, velocity (v), wavelength ($\lambda$), and frequency (f) of a wave are related as follows.

$$\text{Velocity } (v) = \text{Wavelength } (\lambda) \times \text{Frequency } (f) \quad \text{(Equation 1)}$$

Since the first and second sound waves travel in the oscillator 110 (a solid medium) with the same velocity and have the same frequency, the first and second sound waves may have the same wavelength according to Equation 1. Therefore, since the first and second sound waves having the same wavelength are allowed to travel the same first distance $d_1$ and combine with each other, the first and second sound waves may interfere constructively to form the third sound wave.

Referring to FIG. 3B, the first and second piezoelectric members 151 and 152 are disposed left and right and are inclined at a second angle $\theta_2$ from a dashed vertical centerline. The second angle $\theta_2$ is larger than the first angle $\theta_1$. In the current embodiment, the first and second piezoelectric members 151 and 152 are arranged in the same manner as in the embodiment of FIG. 3A except that the second angle $\theta_2$ is larger than the first angle $\theta_1$. That is, in the current embodiment, the first and second piezoelectric members 151 and 152 have the same thickness and generate first and second sound waves having the same frequency.

The first and second sound waves travel in a direction perpendicular to the first and second piezoelectric members 151 and 152 by a second distance $d_2$. Then, the first and second sound waves combine with each other at a combining position (p). A third sound wave is generated at the combining position (p) by constructive interference of the first and second sound waves. Since the second angle $\theta_2$ is greater than the first angle $\theta_1$, the second distance $d_2$ is also greater than the first distance $d_1$.

As shown in FIGS. 3A and 3B, the traveling distance of the first and second sound waves to the combining position (p) is varied according to the inclined angle of the first and second piezoelectric members 151 and 152. The traveling distance of the first and second sound waves substantially corresponds to the length of the oscillator 110. In other words, the inclined angle of the first and second piezoelectric members 151 and 152 is adjusted according to the length of the oscillator 110. For example, if the oscillator 110 is long, the inclined angle of the first and second piezoelectric members 151 and 152 from the dashed vertical centerline may be large. That is, the inclined angle of the first and second piezoelectric members 151 and 152 may range from about 0° to about 90° according to the length of the oscillator 110.

Figure 4A:
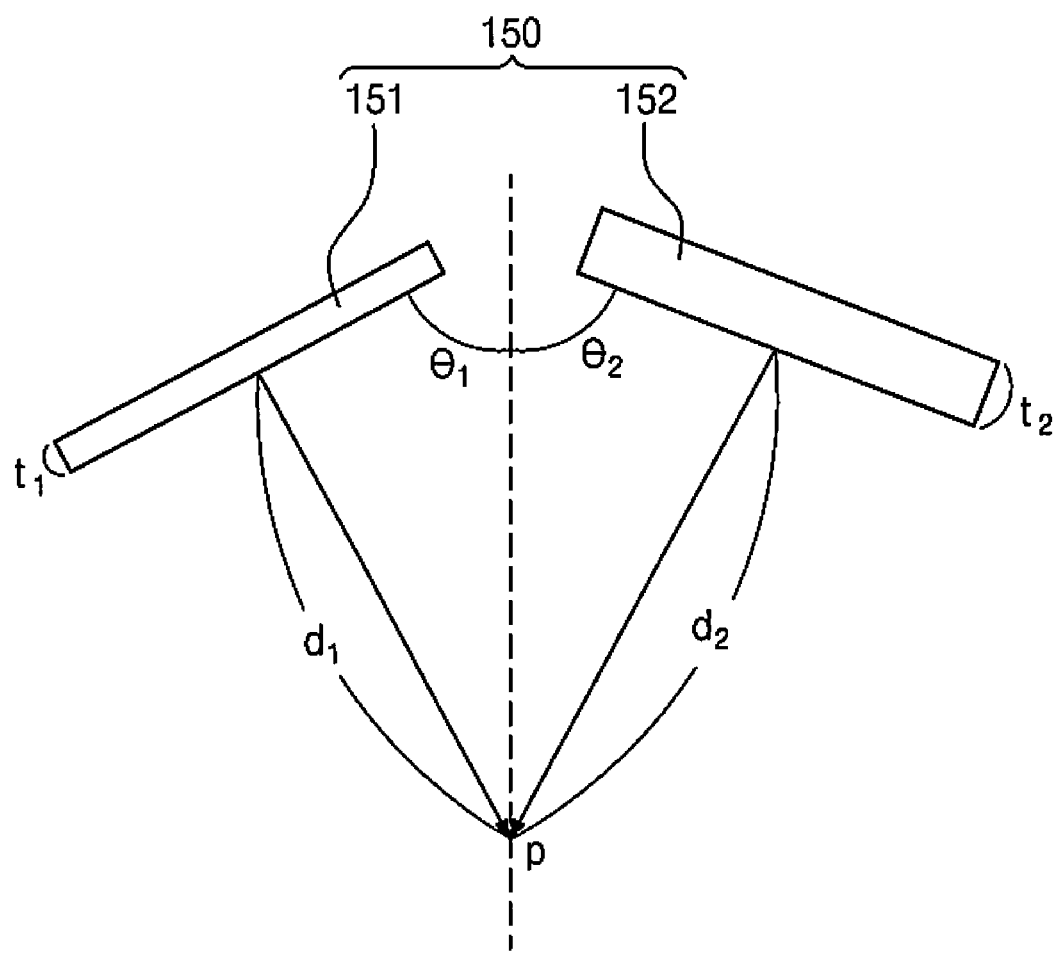
FIGS. 4A and 4B illustrate exemplary asymmetric arrangements of the two piezoelectric members disposed in the vibration generator of the substrate cleaning apparatus of FIG. 1, according to embodiments of the present invention.
Figure 4B:
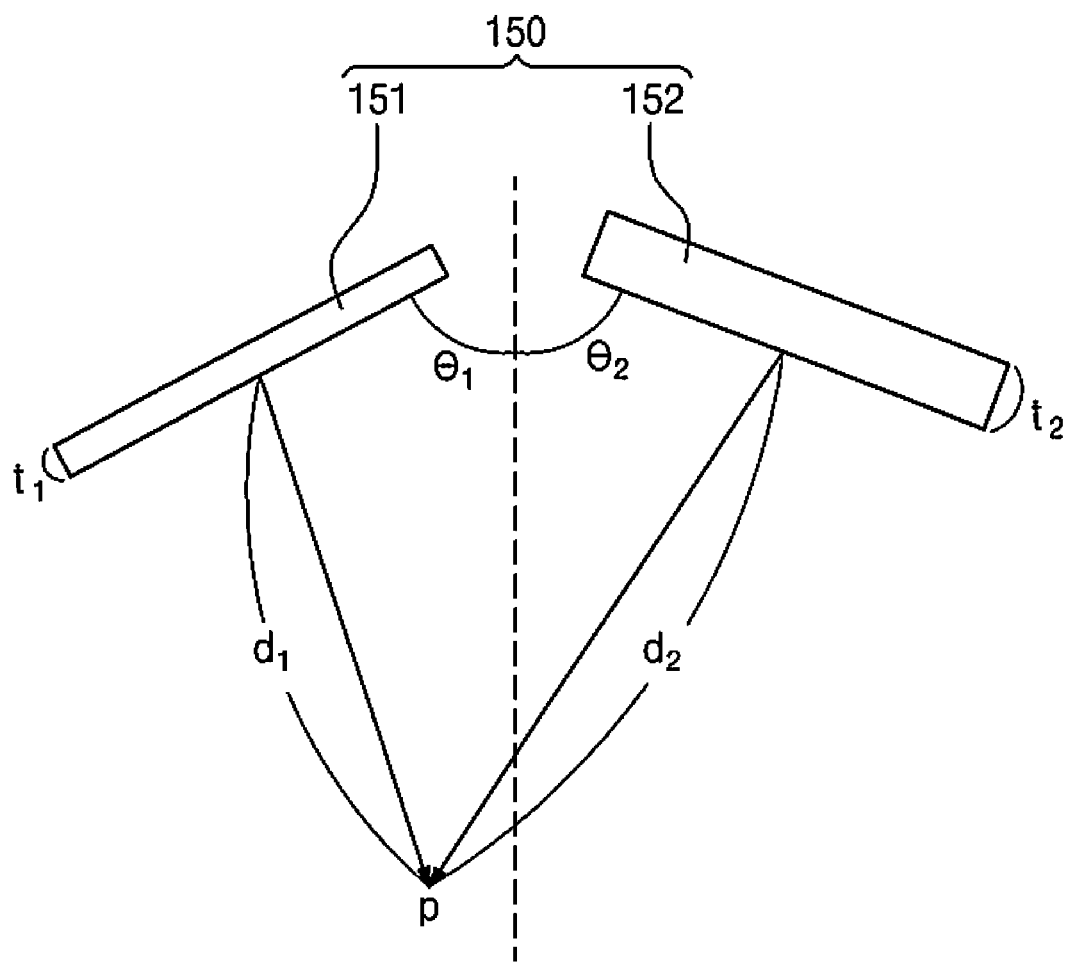

FIGS. 4A and 4B illustrate exemplary asymmetric arrangements of the two piezoelectric members 151 and 152 of the vibration generator 120 of FIG. 1, according to embodiments of the present invention.

Referring to FIG. 4A, the first piezoelectric member 151 has a first thickness $t_1$. The first piezoelectric member 151 is disposed on the left and inclined at a first angle $\theta_1$ from a dashed vertical centerline. The second piezoelectric member 152 has a second thickness $t_2$. The second piezoelectric member 152 is disposed on the right and inclined at a second angle $\theta_2$ from the dashed vertical centerline. The first thickness $t_1$ is smaller than the second thickness $t_2$, and the first angle $\theta_1$ is smaller than the second angle $\theta_2$.

The first piezoelectric member 151 generates a first sound wave, and the second piezoelectric member 152 generates a second sound wave. The first and second sound waves combine with each other at a combining position (p) located on the dashed vertical centerline, thereby producing a third sound wave. The first sound wave travels a first distance $d_1$ to the combining position (p), and the second sound wave travels a second distance $d_2$ to the combining position (p). Since the second angle $\theta_2$ is greater than the first angle $\theta_1$, the second distance $d_2$ is also greater than the first distance $d_1$.

As explained above, as the thickness of a piezoelectric member increases, the frequency of a sound wave generated from the piezoelectric member decreases. Thus, the frequency of the first sound wave generated from the first piezoelectric member 151 is higher than the frequency of the second sound wave generated from the second piezoelectric member 152. Since the first and second sound waves have the same speed (i.e., the speed of sound), the wavelength of the first sound wave is shorter than that of the second sound wave according to Equation 1. That is, the first sound wave having a short wavelength travels the first distance $d_1$ that is relatively shorter than the second distance $d_2$, and the second sound wave having a relatively long wavelength travels the second distance $d_2$ that is relatively longer than the first distance $d_1$. Therefore, the number of wavelengths of the first sound wave included in the first distance $d_1$ may be equal to the number of wavelengths of the second sound wave included in the second distance $d_2$. Accordingly, a third sound wave can be generated by constructive inference of the first and second sound waves.

Although the thicknesses of the first and second piezoelectric members 151 and 152 are set to be equal, the thicknesses of the first and second piezoelectric members 151 and 152 can be slightly different due to process errors. As a result, the frequencies of the first and second sound waves may be different. In this case, the orientations of the first and second piezoelectric members 151 and 152 may be adjusted to make the first and second sound waves interfere constructively so as to produce a third sound wave having maximum intensity.

Referring to FIG. 4B, first and second sound waves combine with each other at a combining position (p) located at the left side of a dashed vertical centerline. In this case, there is a large difference ($d_2$−$d_1$) between traveling distances of the first and second sound waves. Since the second sound wave travels a relatively longer distance than the first sound wave as shown in FIG. 4B, the wavelength of the second sound wave is adjusted to be longer than the wavelength of the first sound wave by making the thickness of the second piezoelectric member 152 greater than the thickness of the first piezoelectric member 151.

The embodiment of FIG. 4B may be applied to the case where the oscillator 110 makes an oblique angle with the substrate 20 as shown in FIG. 1. In the case of FIG. 1, an end of the oscillator 110 at which first and second sound waves are generated is inclined at an oblique angle from a horizontal line, and the other end of the oscillator 110 at which the first and second sound waves combine with each other is parallel with the horizontal line. In other words, both ends of the oscillator 110 are asymmetric. Thus, the traveling distances of the first and second sound waves are set to be different.

If the traveling distance difference ($d_2-d_1$) is large as shown in FIG. 4B, the thicknesses or oblique angles of the first and second piezoelectric members 151 and 152 may be set to be different according to the traveling distance difference ($d_2-d_1$) so as to allow the first and second sound waves to interfere constructively at the combing position (p). However, in the case where the traveling distance difference ($d_2-d_1$) is negligibly small or the oscillator 110 is disposed in a direction perpendicular to the substrate 20, the embodiments shown in FIG. 3A or 3B may be suitable.

Figure 5:
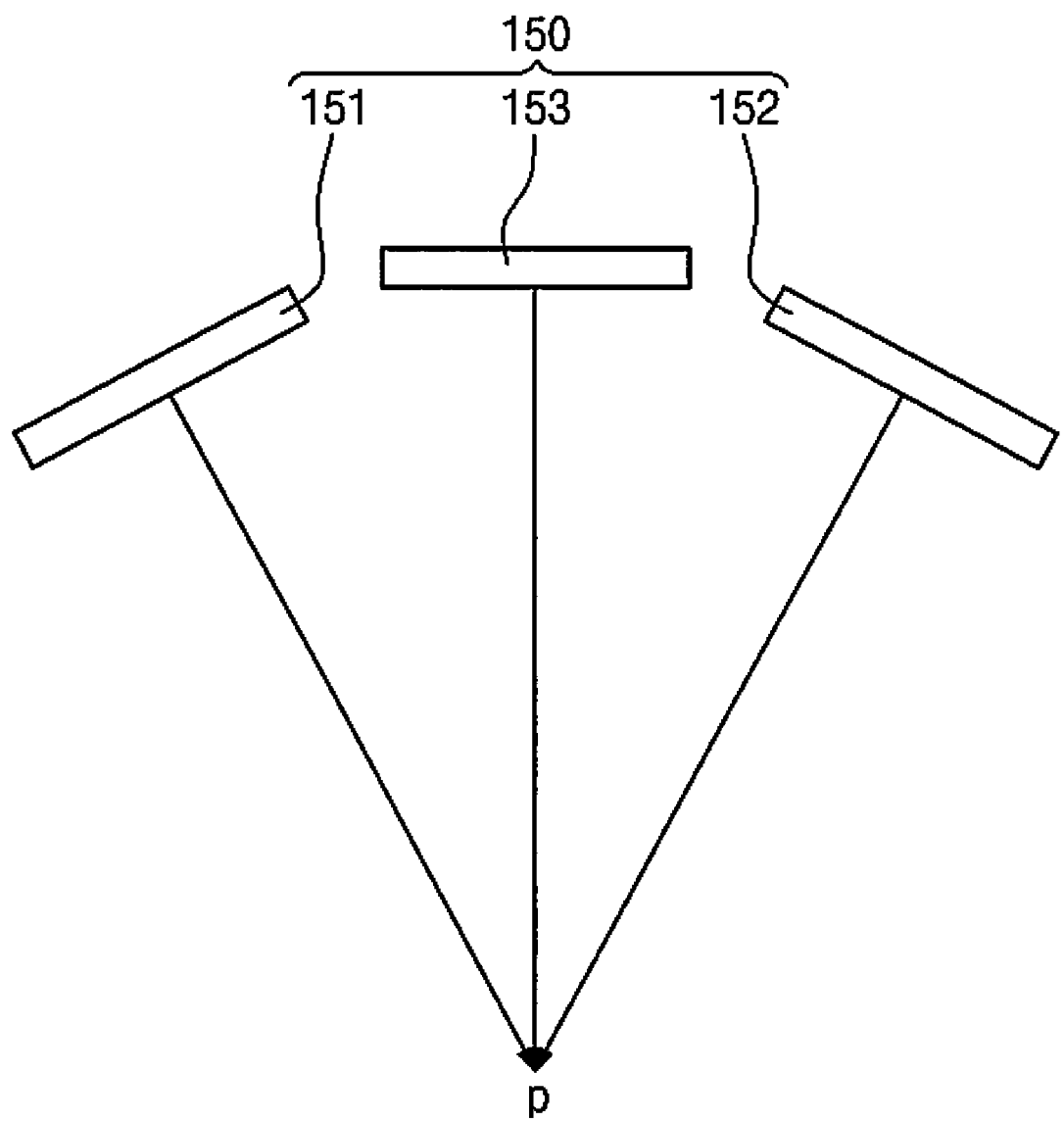
FIG. 5 illustrates an exemplary case where the vibration generator of the substrate cleaning apparatus of FIG. 1 includes three piezoelectric members, according to an embodiment of the present invention.

FIG. 5 illustrates an exemplary case where the vibration generator 120 of FIG. 1 includes three piezoelectric members, according to an embodiment of the present invention.

Referring to FIG. 5, a piezoelectric unit 150 includes a first piezoelectric member 151, a second piezoelectric member 152, and a third piezoelectric member 153. The first to third piezoelectric members 151 to 153 generate first to third sound waves, respectively. The first to third piezoelectric members 151 to 153 have the same thickness, and the first to third sound waves have the same wavelength. The first and second piezoelectric members 151 and 152 are symmetrically disposed with respect to the third piezoelectric member 153. The first to third sound waves travel the same distance to a combing position (p), and then the first to third sound waves combine with each other. Therefore, a strong sound wave can be generated by constructive interference of the first to third sound waves, and the substrate 20 can be efficiently cleaning using the strong sound wave.

Alternatively, the first to third piezoelectric members 151 to 153 may be asymmetrically arranged or have different thicknesses. In addition, if a stronger sound wave is necessary, four or more piezoelectric members can be used.

Figure 6A:
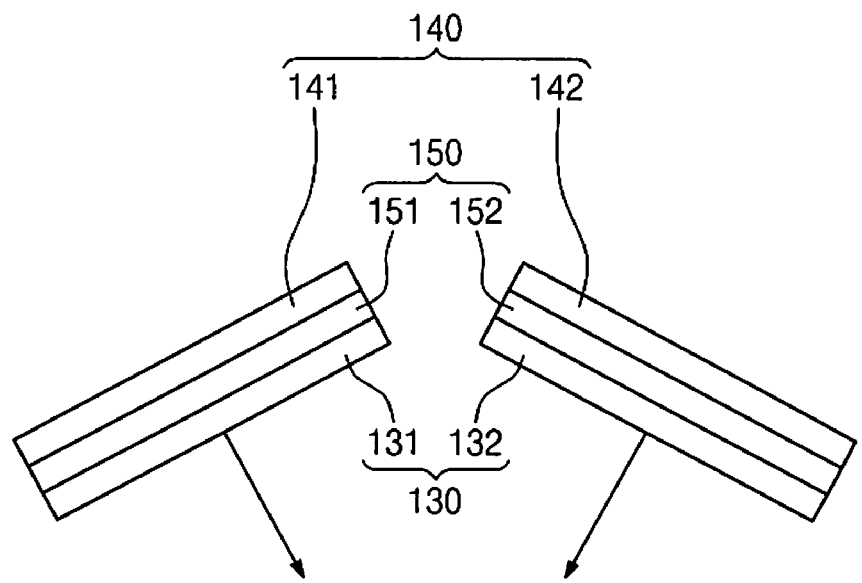
FIGS. 6A and 6B illustrate stacked structures of piezoelectric members and electrodes installed in the vibration generator of the substrate cleaning apparatus illustrated in FIG. 1, according to embodiments of the present invention.
Figure 6B:
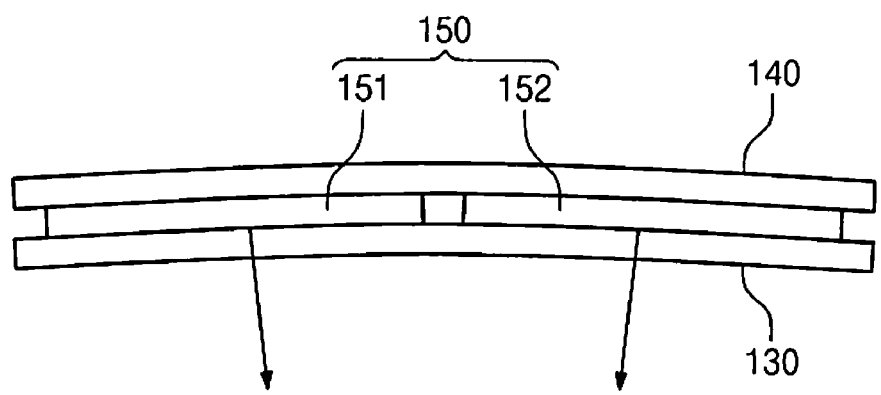

FIGS. 6A and 6B are views illustrating exemplary stacked structures of a piezoelectric unit 150 and first and second electrodes 130 and 140 installed in the vibration generator 120 of FIG. 1, according to embodiments of the present invention.

Referring to FIG. 6A, the piezoelectric unit 150, and the first and second electrodes 130 and 140 are illustrated. The piezoelectric unit 150 includes a first piezoelectric member 151 and a piezoelectric member 152. The first electrodes 130 include left and right electrodes 131 and 132, and the second electrodes 140 include left and right electrodes 141 and 142. The first piezoelectric member 151 is disposed between the left electrode 131 and the left electrode 141. The piezoelectric member 152 is disposed between the right electrode 132 and the right electrode 142. The first and second electrodes 130 and 140 function as cathodes and anodes for supplying electric energy to the first and second piezoelectric members 151 and 152. The piezoelectric unit 150 disposed between the first and second electrodes 130 and 140 receives the electric energy. Then, the piezoelectric unit 150 generates sound waves using the electric energy based on the piezoelectric effect. In the current embodiment, a plurality of first electrodes 130 and a plurality of second electrodes 140 are provided for the first and second piezoelectric members 151 and 152. In this case, the left electrodes 131 and 141 and the right electrodes 132 and 142 may receive different electric energies according to physical properties of the first and second piezoelectric members 151 and 152.

Referring to FIG. 6B, a piezoelectric unit 150, and first and second electrodes 130 and 140 are illustrated. The piezoelectric unit 150 includes a first piezoelectric member 151 and a piezoelectric member 152. The first and second electrodes 130 and 140 are used for both the piezoelectric members 151 and 152. In this case, the same electric energy may be supplied to the first and second piezoelectric members 151 and 152. The structure of the current embodiment may be suitable for the case where the first and second piezoelectric members 151 and 152 are nearly horizontally arranged.

The substrate cleaning apparatus has been described according to the exemplary embodiments of the present invention. Hereinafter, a method for cleaning a substrate based on the operation principles of the substrate cleaning apparatus will be described in brief according to an embodiment of the present invention. The substrate cleaning method will now be described based on the assumption that the substrate cleaning method is performed using the substrate cleaning apparatus of FIG. 1. Thus, reference numerals used in FIG. 1 will be used for the same elements in the following description. However, the substrate cleaning method is not limited to the substrate cleaning apparatus of FIG. 1. That is, the substrate cleaning method can be applied to other substrate cleaning apparatuses.

FIG. 7 is a flowchart illustrating a method of cleaning a substrate according to an embodiment of the present invention.

Referring to FIG. 7, in operation S10, a substrate 20 is transported to the cleaning container 1 and is loaded on the stage 10. In operation S20, a cleaning liquid is supplied to the substrate 20 from the cleaning liquid supply unit 40. In operation S30, a sound or ultrasonic wave is applied to the substrate 20 for cleaning the substrate 20. The sound wave is a combined sound wave generated by combining at least two sound waves produced from at least two sources. The combined sound wave has sufficient energy because the combined sound wave is generated by constructive interference of at least two sound waves. Thus, fine impurity particles can be easily removed from the substrate 20 using the combined sound wave.

The sources of the sound waves are piezoelectric members. The piezoelectric members are properly arranged and configured so that sound waves generated from the piezoelectric members can interfere constructively. For example, when the piezoelectric members have the same shape, sound waves generated from the piezoelectric members may travel the same distance. Then, the sound waves may interfere constructively. Alternatively, when the piezoelectric members have different thicknesses, sound waves generated from the piezoelectric members may travel different distances and then may interfere constructively.

According to the present invention, a substrate can be cleaned more efficiently by applying a strong sound wave to the substrate.

As described above, according to the embodiments of the present invention, impurities can be effectively removed from a substrate, and thus substrate cleaning efficiency can be improved. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus for cleaning a substrate, comprising:
   a stage on which a substrate is loaded;
   a cleaning liquid supply unit supplying a cleaning liquid to the substrate;
   an oscillator transmitting sound waves to the substrate for cleaning the substrate; and
   at least two piezoelectric members disposed on an end portion of the oscillator at a predetermined distance apart from each other so as to generate the sound waves, wherein the at least two piezoelectric members comprise a first piezoelectric member and a second piezoelectric of different thicknesses.

2. The apparatus of claim 1, further comprising:
   electrodes facing each other with the piezoelectric members being disposed between the electrodes; and
   a vibration generator in which the piezoelectric members and the electrodes are disposed, the vibration generator being coupled to the end portion of the oscillator.

3. The apparatus of claim 1, further comprising:
   first electrodes facing each other with the first piezoelectric member being disposed between the first electrodes;
   second electrodes facing each other with the second piezoelectric member being disposed between the second electrodes; and
   a vibration generator in which the first and second piezoelectric members and the first and second electrodes are disposed, the vibration generator being coupled to the end portion of the oscillator.

4. The apparatus of claim 1, wherein the first and second piezoelectric members have the same shape.

5. The apparatus of claim 1, wherein the oscillator is shaped like a rod, and the first and second piezoelectric members are symmetrically disposed with respect to an imaginary line passing through a center of the oscillator and parallel with a length direction of the oscillator.

6. The apparatus of claim 5, wherein the first and second piezoelectric members and the imaginary line are adjusted at predetermined angles from each other according to a length of the oscillator.

7. The apparatus of claim 1, wherein the oscillator is shaped like a rod, and the first and second piezoelectric members are asymmetrically disposed with respect to an imaginary line passing through a center of the oscillator and parallel with a length direction of the oscillator.

8. The apparatus of claim 1, wherein the stage is a chuck configured to fix the substrate utilizing a vaccum force or an electric force and is connected to a motor for rotating the chuck.

9. The apparatus of claim 1, wherein the cleaning liquid is selected from the group consisting of deionized water, aqueous ammonia, hydrogen peroxide, hydrofluoric acid, ammonium fluoride, phosphoric acid, and mixtures thereof.

10. The apparatus of claim 1, wherein the oscillator is inclined at an angle from the substrate.

11. The apparatus of claim 1, wherein the oscillator is parallel or perpendicular to the substrate.

12. The apparatus of claim 1, wherein the at least two piezoelectric members generate the sound waves, respectively, and the sound waves interfere constructively with each other at a surface of the oscillator adjacent to the substrate.

* * * * *